(12) United States Patent  (10) Patent No.: US 6,536,131 B2
Davis  (45) Date of Patent: Mar. 25, 2003

(54) WAFER HANDLING SYSTEM

(75) Inventor: Jeffry Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/735,154

(22) Filed: Dec. 12, 2000

(65) Prior Publication Data

US 2001/0012481 A1 Aug. 9, 2001

Related U.S. Application Data

(63) Continuation-in-part of application No. 09/611,709, filed on Jul. 7, 2000, now abandoned, which is a continuation-in-part of application No. 09/274,511, filed on Mar. 23, 1999, now Pat. No. 6,275,724, which is a continuation-in-part of application No. 09/112,259, filed on Jul. 8, 1998, now Pat. No. 6,273,110, which is a continuation-in-part of application No. 08/994,737, filed on Dec. 19, 1997, now Pat. No. 6,447,232, which is a continuation-in-part of application No. 08/851,480, filed on May 5, 1997, now abandoned, application No. 09/735,154, which is a continuation-in-part of application No. 09/187,652, filed on Nov. 6, 1998, now abandoned, which is a continuation-in-part of application No. 08/851,480.

(51) Int. Cl.$^7$ ................................ F26B 17/24

(52) U.S. Cl. ................................ 34/58; 34/317; 34/60; 414/222.04; 414/225.01; 414/226.01; 414/267; 414/404

(58) Field of Search .............................. 34/317, 58, 60; 414/222.04, 225.01, 226.01, 267, 404, 539, 806, 938, 940

(56) References Cited

U.S. PATENT DOCUMENTS 4,571,850 A * 2/1986 Hunt et al. ................... 34/242
4,907,349 A * 3/1990 Aigo ............................. 34/58
5,660,517 A * 8/1997 Thompson et al. ......... 414/217
5,882,168 A * 3/1999 Thompson et al. ......... 414/416

* cited by examiner

Primary Examiner—William Doerrler
Assistant Examiner—Mark Shulman
(74) Attorney, Agent, or Firm—Perkins Coie LLP

(57) ABSTRACT

A semiconductor wafer processing system has a carrier including wafer slots. A process robot engages the carrier and installs the carrier into a rotor within a process chamber. The rotor has a tapered or stepped inside surface matching a tapered or stepped outside surface of the carrier. Wafer retainers on the carrier pivot to better secure wafers within the carrier.

25 Claims, 17 Drawing Sheets

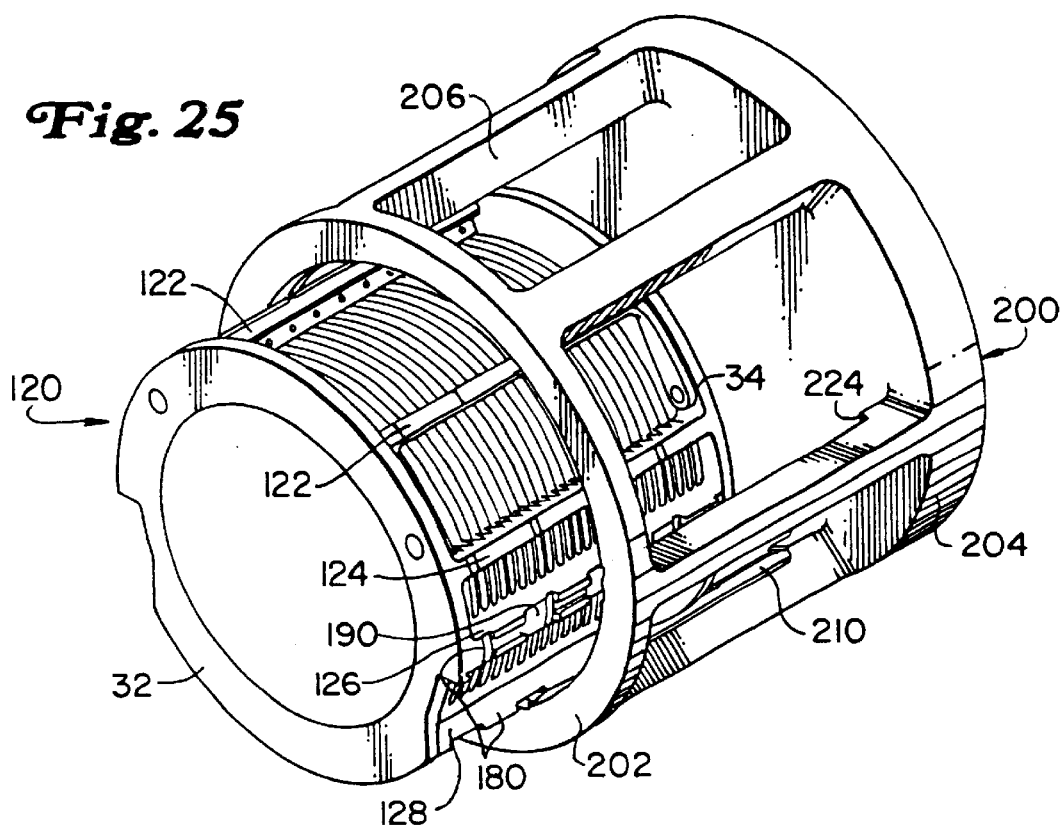
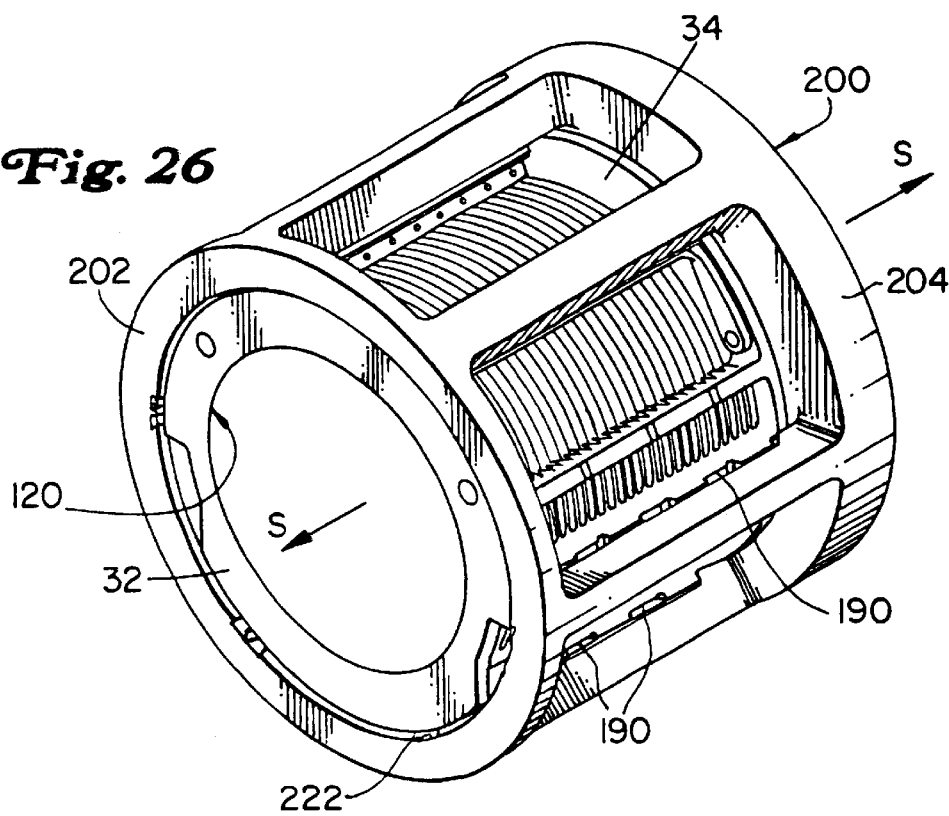

WAFER HANDLING SYSTEM

This application is a continuation-in-part of U.S. patent application Ser. No. 09/611,709, filed Jul. 7, 2000, and now abandoned and retained, which is a continuation-in-part of U.S. patent application Ser. No. 09/274,511, filed Mar. 23, 1999 and now pending, which is a continuation-in-part of U.S. patent application Ser. No. 09/122,259, filed Jul. 8, 1998, and now pending, which is a continuation-in-part of U.S. patent application Ser. No. 08/994,737, filed Dec. 19, 1997, and now pending, which is a continuation-in-part of U.S. patent application Ser. No. 08/851,480, filed May 5, 1997 and now abandoned, which is a continuation of U.S. patent application Ser. No. 08/680,463, filed Jul. 15, 1996, and now U.S. Pat. No. 5,664,337. Priority to these applications is claimed under 35 USC §120, and these applications are incorporated herein by reference. U.S. patent application Ser. No. 09/612,009, filed on Jul. 7, 2000, is also incorporated herein by reference.

This application is also a continuation-in-part of Ser. No. 09/187,652, filed Nov. 6, 1998 and now abandoned, which is a continuation-in-part of Ser. No. 08/851,480, filed May 5, 1997, now abandoned. Priority to these Applications is also claimed under 35 USC §120.

BACKGROUND OF THE INVENTION

Computers, televisions, telephones and other electronic product contain large numbers of essential electronic semiconductor devices. To produce electronic products, hundreds or thousands of semiconductor devices are manufactured in a very small space, using lithography techniques on semiconductor substrates, such as on silicon wafers. Due to the extremely small dimensions involved in manufacturing semiconductor devices, contaminants on the semiconductor substrate material, such as particles of dust, dirt, paint, metal, etc. lead to defects in the end products.

Existing automated semiconductor processing system use robots, carriers, rotors, and other devices, to move and process wafers. These systems are designed to avoid creating particles which may contaminate the wafers. However, even with careful design, material selection, and system operation, particles may still be created by the moving parts of the systems, or by the contacting or abrasion of wafers by components of such systems.

Many automated semiconductor processing systems use centrifugal wafer processors, which spin the wafers at high speed, while spraying or otherwise applying process fluids and/or gases onto the wafers. The rotors typically hold a batch of wafers in a parallel array. While the close spacing of the wafers in such rotors has advantages, such as providing a compact design, if a single wafer breaks while within the rotor, the wafer pieces will often damage adjacent wafers.

During centrifugal processing of wafers within a rotor, it is important to have the process liquids contact the wafer surfaces in a substantially uniform way, so that all useable surfaces of the wafers receive substantially consistent processing, and so that all wafers within the batch of wafers in the rotor (as well as subsequent batches) are generally uniformly processed. As a result, it is advantageous for the rotor in the process chamber (as well as any tray or carrier installed into the rotor) to have a structure which allows the process liquids and/or gases to be sprayed through and onto the wafers. On the other hand, the wafers must be adequately supported to avoid excessive stress and wafer breakage so that the rotor must have adequate structural elements. In addition, as the rotor is typically cantilevered on a shaft extending from the back end of the centrifugal process chamber, and because the rotor may be exposed to large centrifugal forces when spinning at high speed, while remaining substantially centrifugally balanced, the rotor must be relatively rigid and strong. These requirements present design engineering challenges, as the increased material mass and thicker wall sections often used to achieve a strong and rigid design also tend to provide a more closed rotor structure, tending to limit the inflow/inspray of process fluids or gases.

Accordingly, there is a need for improved apparatus and methods for handling and processing wafers.

SUMMARY OF THE INVENTION

In a first aspect of the invention, an automated semiconductor wafer processing system has a carrier having wafer slots for holding wafers. The carrier preferably has tapered outside walls. A rotor in a centrifugal wafer processor has inner walls having a corresponding taper. The carrier is secured within the rotor, with minimum space requirements. Alternatively, the carrier preferably has step ribs and or lug ribs having a plurality of incrementally stepped carrier diameter surfaces. The rotor has corresponding incrementally stepped rotor diameter surfaces adapted to engage the carrier surfaces, when the carrier is installed into the rotor.

In a second and separate aspect of the invention, the carrier has a large number of comb slots extending circumferentially between ribs. The comb slots provide an open yet strong and rigid structure. Process chemicals and gases can pass through the rotor to reach the wafers within the rotor.

In a third and separate aspect of the invention, the comb slots are aligned or centered over the wafers. This allows a spray of process liquids to travel straight from spray nozzles to the wafers.

Other advantages will appear. The invention resides not only in the systems (and methods), but also in the subsystems and sub-combinations described and illustrated. The features shown with one embodiment may also be used with other embodiments.

BRIEF DESCRIPTION OF THE DRAWINGS

In the drawings, wherein the same reference number indicates the same element through the several views:

FIG. 25 is a perspective view thereof with the carrier partially installed in the rotor.

FIG. 26 is a perspective view thereof showing the carrier fully installed in the rotor.

DETAILED DESCRIPTION OF THE DRAWINGS

Figure 9:
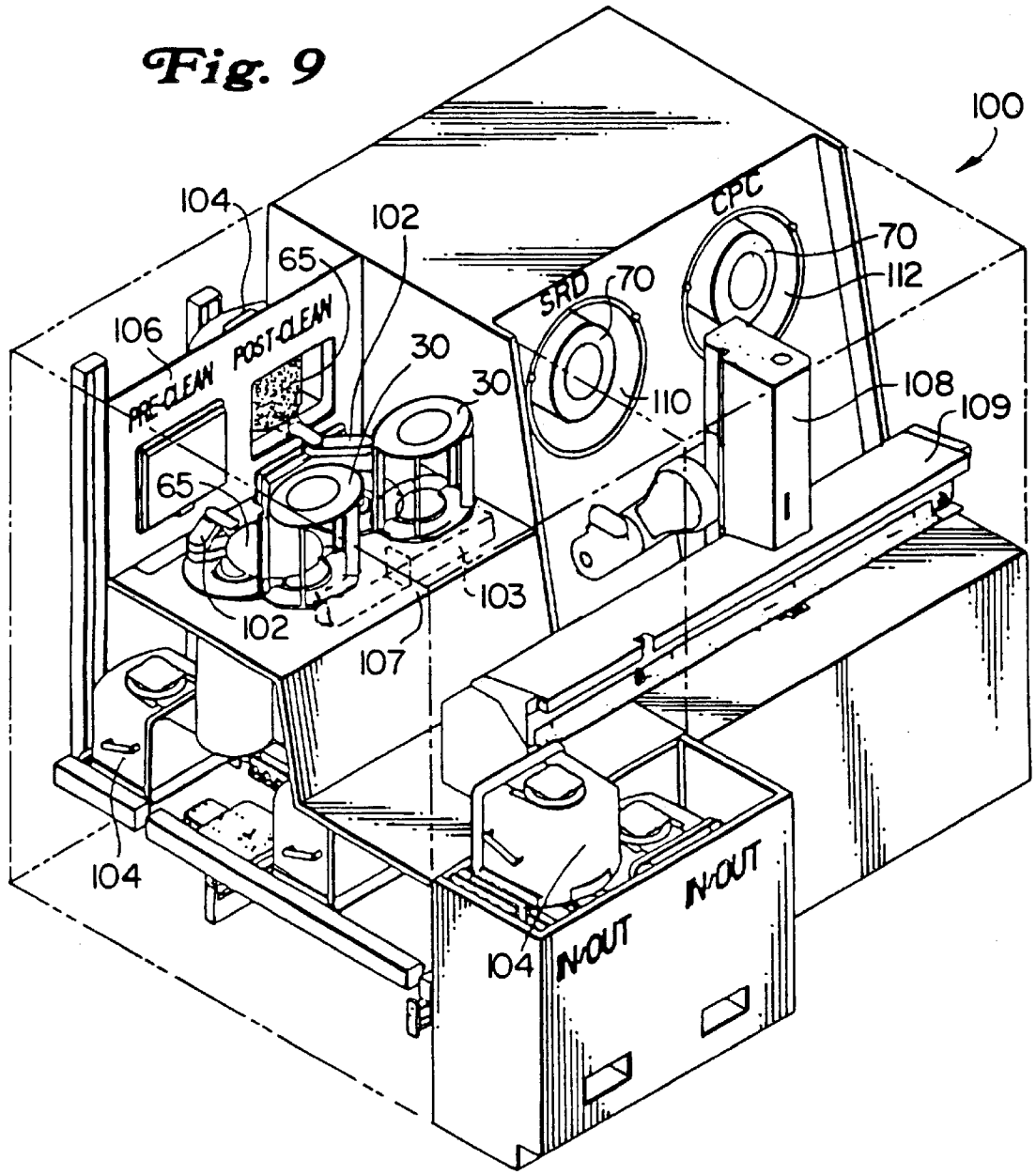
FIG. 9 is a front, top and left side perspective view of a semiconductor wafer processing system, including the carrier and rotor shown in the Figures described above.
Figure 10:
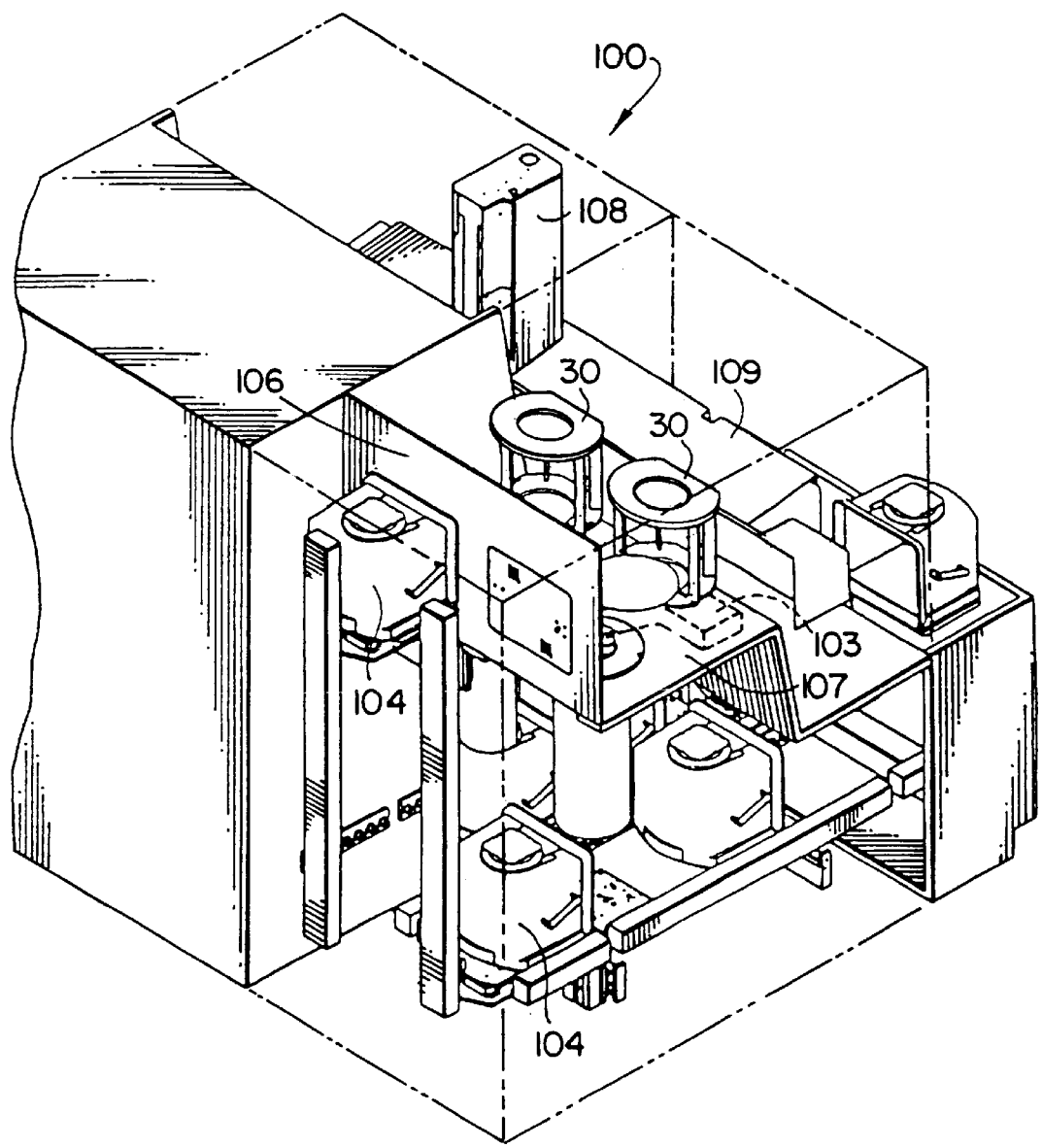
FIG. 10 is a top, back and left side perspective view of the semiconductor wafer processing system shown in FIG. 9.

Turning now in detail to the drawings, as shown in FIGS. 9 and 10, a semiconductor wafer processing system 100 has a transfer robot 102 which transfers wafers 65 from a pod 104 at a docking station 106 to a carrier 30. A process robot 108 moves laterally along a rail 109, to carry carriers 30 holding wafers 65 from the docking station 106 to process chambers 110 and 112.

Figure 1:
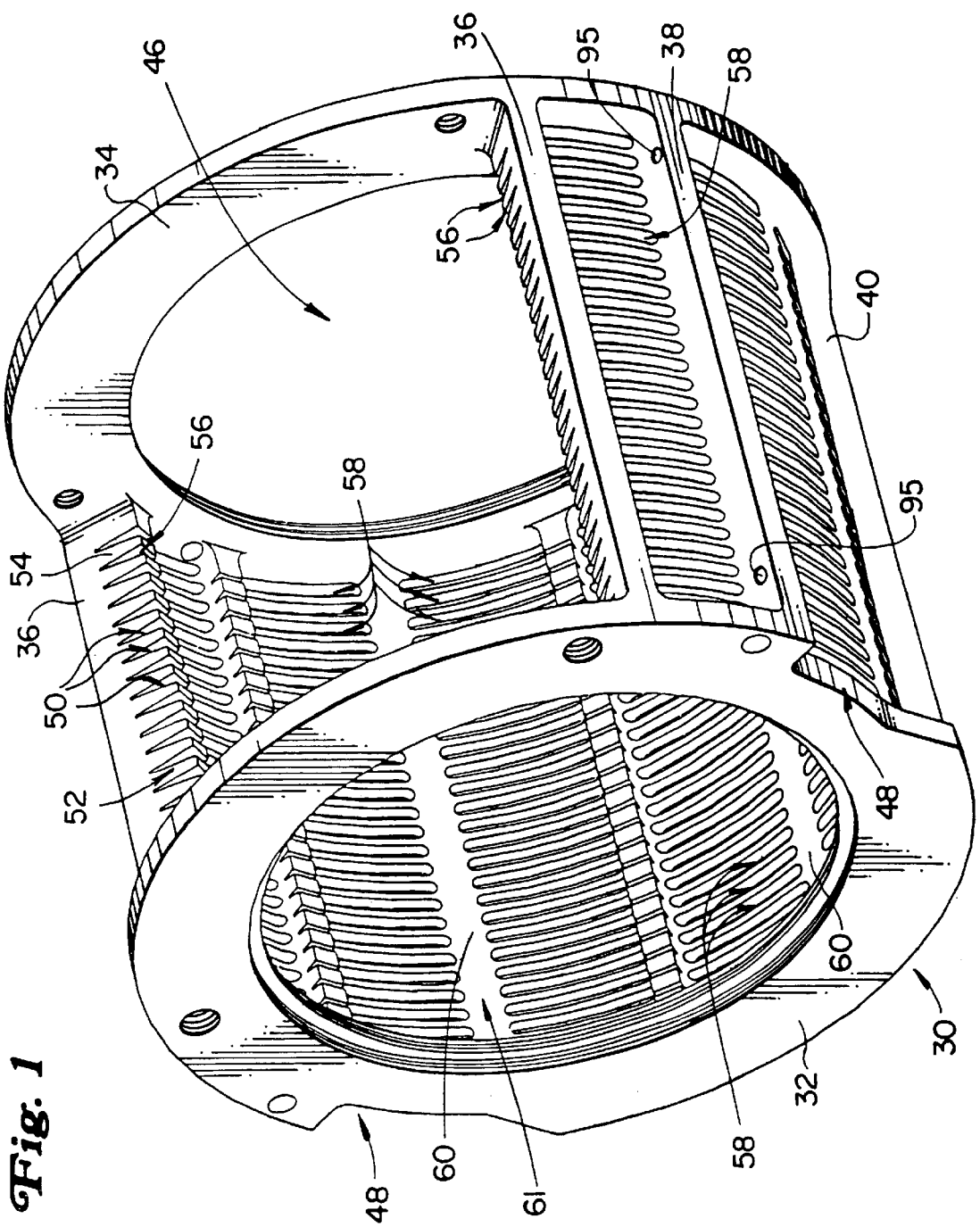
FIG. 1 is a perspective view of the carrier of the invention, with certain components removed for illustration purposes.

Referring to FIG. 1, the carrier 30 has a front ring 32 attached to a back ring 34 by a pair of upper ribs 36, a pair of side ribs 38, and a pair of lower ribs 40.

Figure 2:
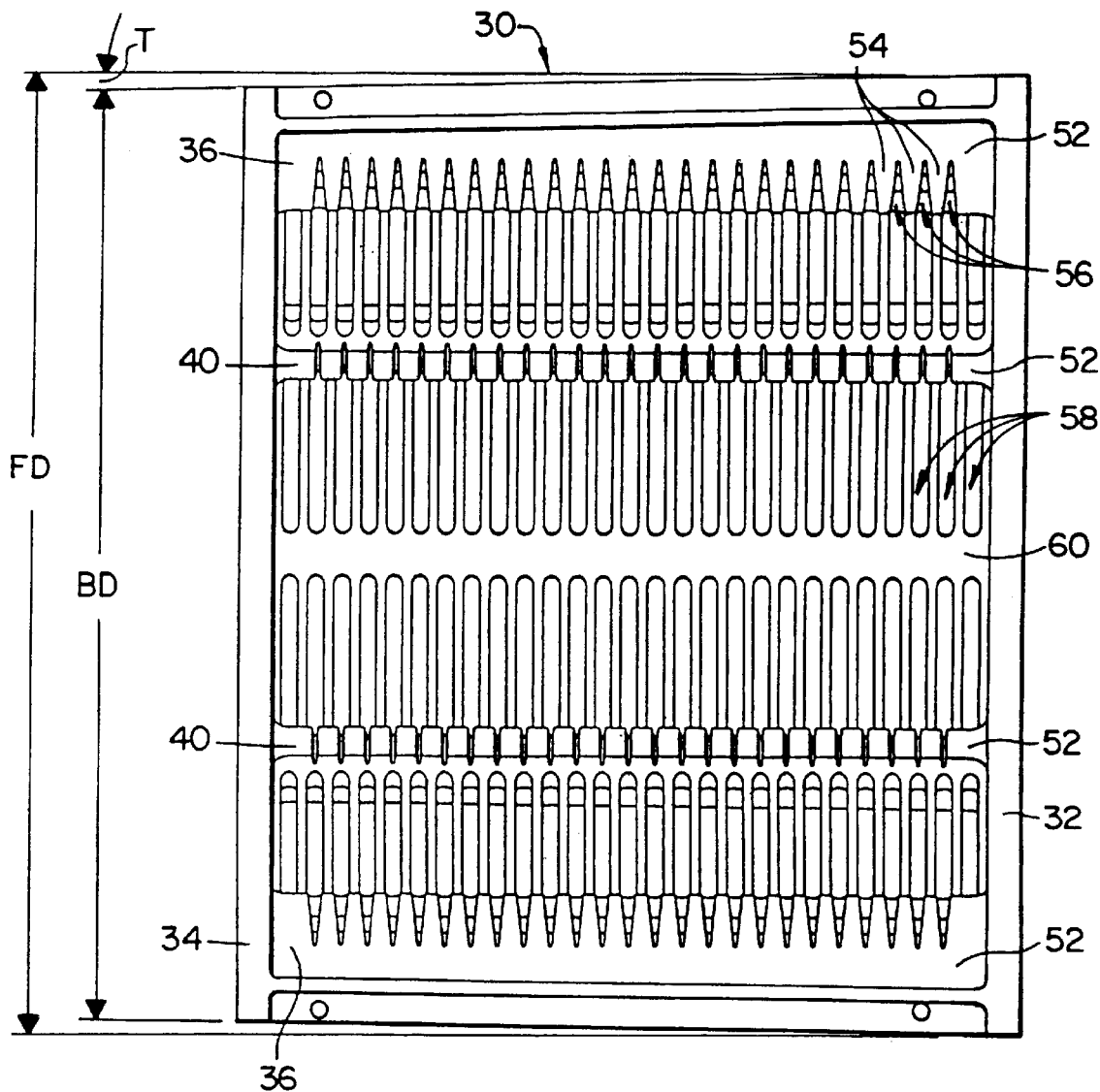
FIG. 2 is a side view of the carrier shown in FIG. 1.
Figure 3:
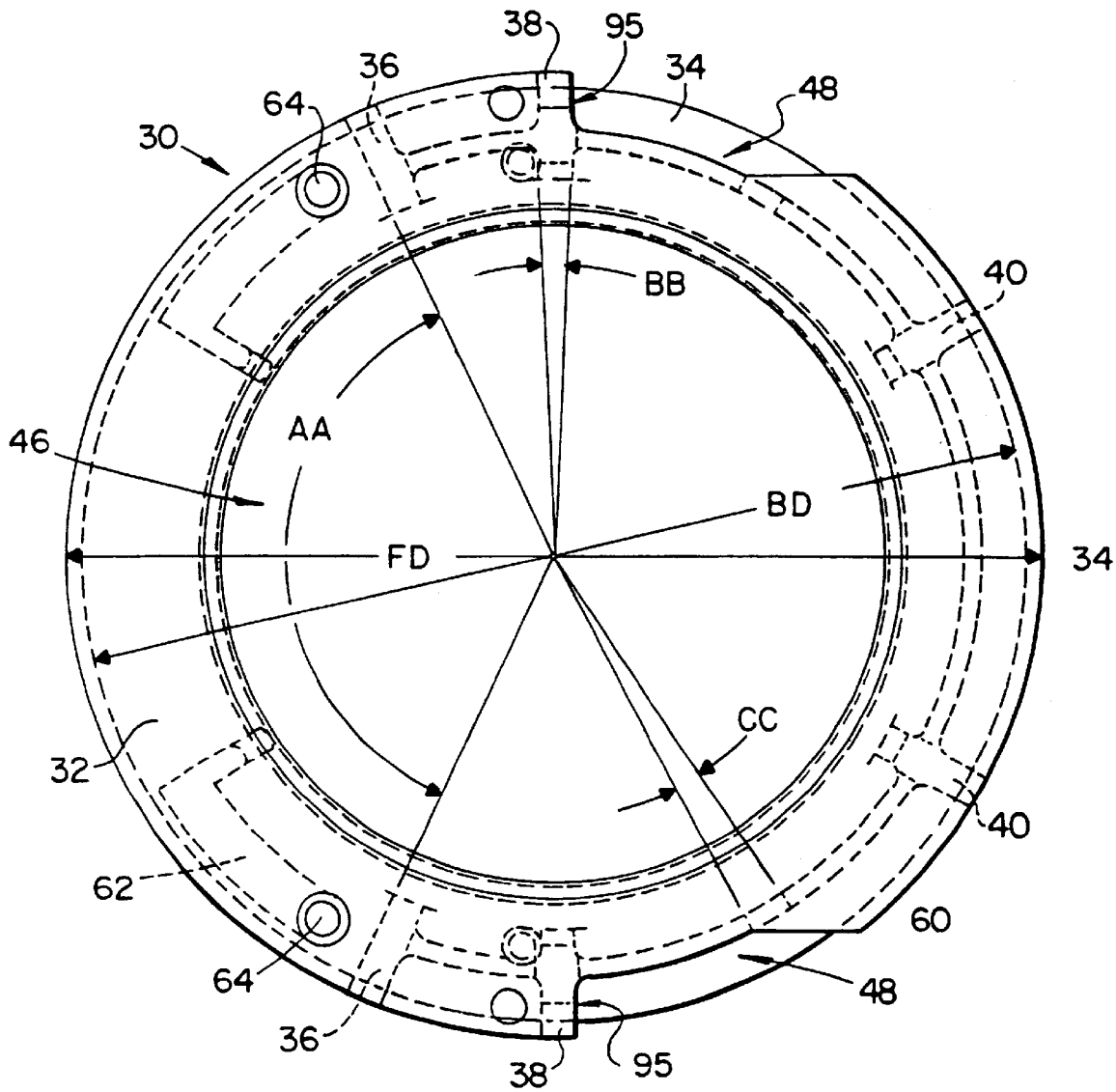
FIG. 3 is a front or top view of the carrier shown in FIG. 1.

Referring now to FIGS. 1, 2 and 3, the carrier 30 has a wafer opening 46, generally extending in an arc between the spaced apart upper ribs 36. The arc of the wafer opening 46, indicated as AA in FIG. 3, allows wafers 65 to be placed into the carrier 30. The arc AA is preferably about 110–150 degrees, more preferably about 120–140 degrees. In the embodiment shown, arc or angle AA is about 130 degrees.

Arm slots 48 are formed on opposite sides of the front or top ring 32, just under the side ribs 38, as shown in FIG. 1.

A plurality of circumferential wafer slots 50 are formed within the carrier 30. Combs 52 having rows of comb teeth 54 separated by teeth slots 56 are formed on the inside surfaces of the upper ribs 36, side ribs 38, and lower ribs 40. The teeth slots 56 at each wafer position form the circumferential wafer slots 50.

Referring to FIGS. 1 and 2, cylindrical carrier wall sections extend between the ribs 36, 38, and 40. However, there is no cylindrical wall section between the two upper ribs, at the wafer opening 46. Elongated comb slots 58 formed in the cylindrical sidewalls 61 extend between each of the ribs 36, 38 and 40. As shown in FIG. 2, the comb slots 58 are aligned with the teeth slots 56, so that when a wafer 65 is placed into a wafer slot 50, a comb slot 58 will be centrally aligned with the wafer edge. A slot ridge 60 is optionally provided between the side ribs 38 and lower ribs 40, to strengthen the sidewalls 61, which are largely open space due to the extensive comb slots 58. The slot bridges 60, if used, divide the comb slots 58 extending between the side ribs 38 and lower ribs 40.

For clarity of illustration, the carrier 30 shown in FIGS. 1–3 is illustrated without the wafer retainer assemblies 62, front end cap 42 and back end cap 44, which are shown in subsequent drawing Figures.

Referring to FIG. 2, the carrier 30, although appearing cylindrical in FIG. 1, has slightly tapering side walls. The outside surfaces of the ribs 36, 38 and 40 are not parallel, but rather, have a slight conical taper of angle T, shown in FIG. 2, preferably 0.2–5.0 degrees, more preferably from about 0.5–2.0 degrees. As a result of this conical taper, the diameter FD of the front or top ring 32 of the carrier 30 is greater than the diameter BD of the lower or back ring 34.

Figure 5:
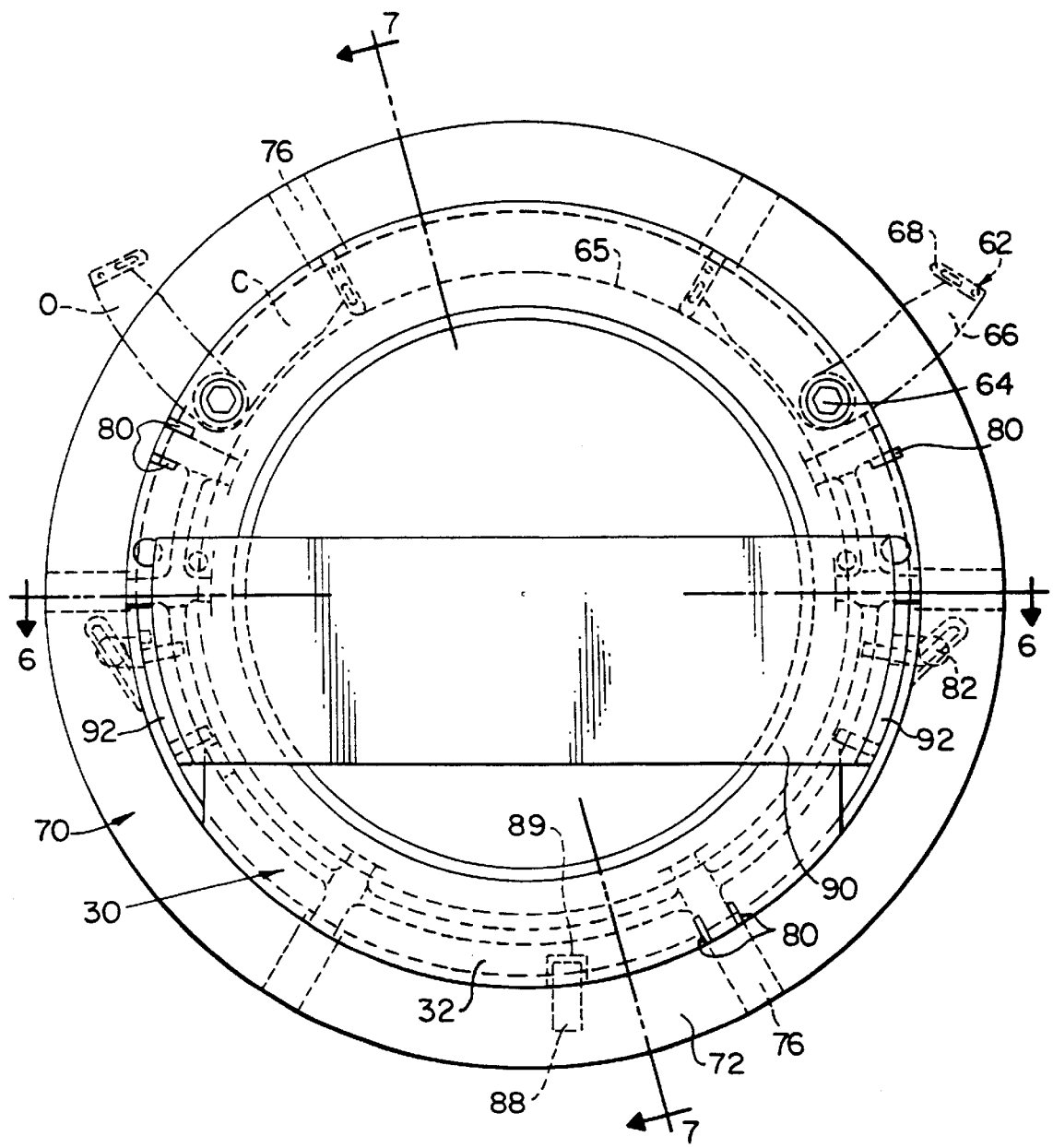
FIG. 5 is a front or top view of the carrier and rotor shown in FIG. 4.

Referring now to FIG. 5, the carrier 30 has a pair of wafer retainers 62 pivotable from the open position O shown in dotted lines in FIG. 5, to the closed position C, also shown in dotted lines in FIG. 5. The wafer retainer 62 may only be moved into the open position O when the carrier 30 is out of the rotor 70. The wafer retainers 62 are shown in the open position in FIG. 5, which shows the carrier 30 within the rotor 30, only for purposes of illustration.

Referring still to FIG. 5, each wafer retainer 62 has a retainer arm 66 pivotably attached to the front ring 32 of the carrier 30 via a retainer pivot joint 64. An elastomeric edge strip 68 is provided at the outer end of the retainer arm 66, for resiliently engaging the edges of the wafers 65.

Figure 4:
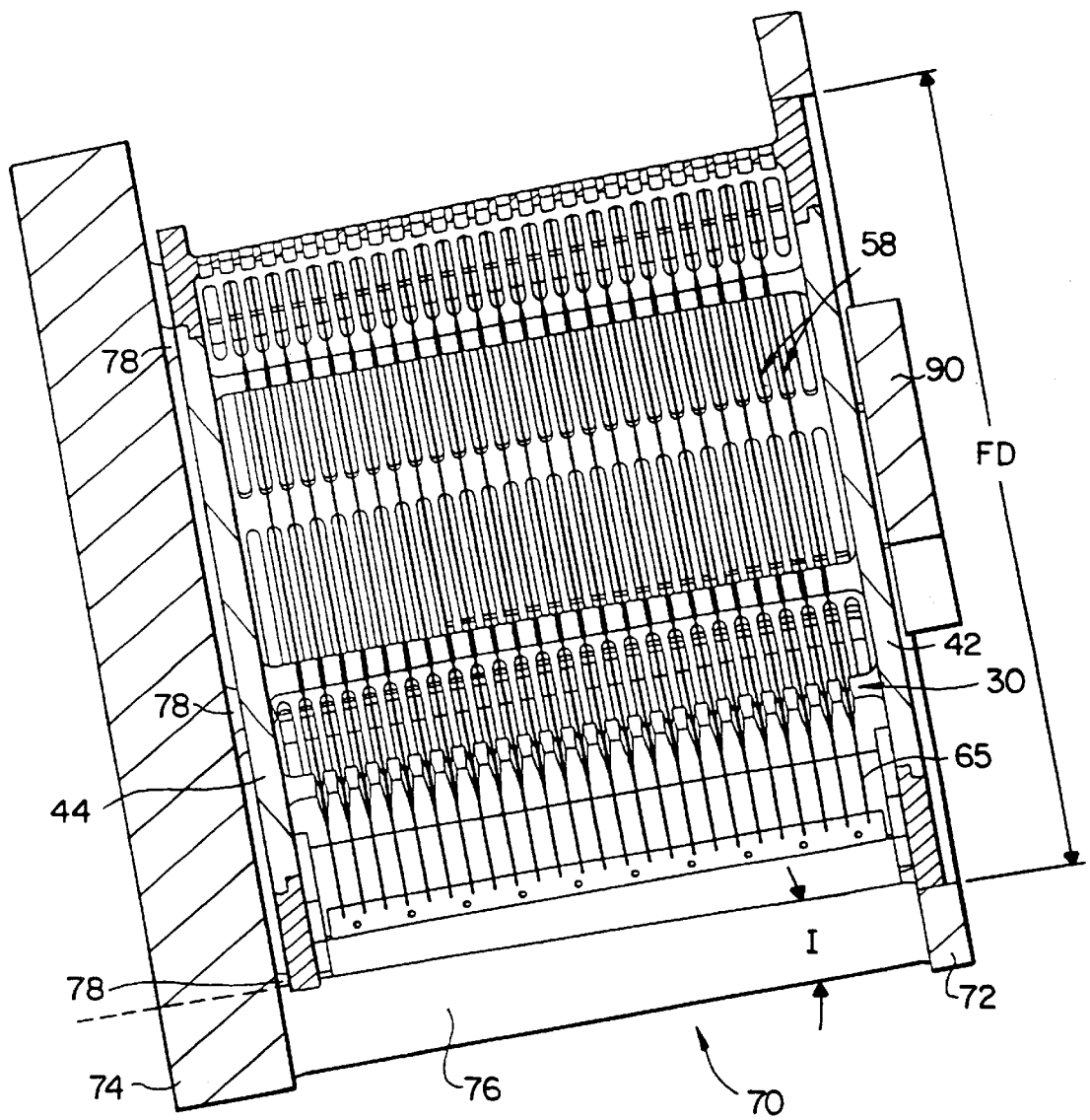
FIG. 4 is a side view, in part section, of the carrier of FIG. 1 installed within a rotor of a centrifugal processor.
Figure 13:
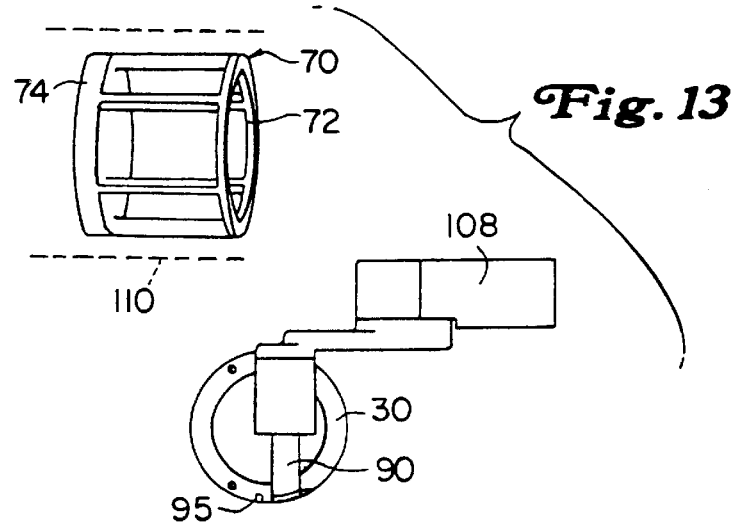
FIG. 13 is a top view thereof.

Referring to FIGS. 4, 5, and momentarily as well to FIGS. 9 and 13, a rotor 70 is positioned within each of the process chambers 110 and 112. The rotor 70 is attached to a drive shaft linked to a motor which spins the rotor within the chambers, as is well known in the centrifugal processing field. The rotor 70 has a front ring 72 and a back ring 74 connected by (preferably six) side bars 76. Accordingly, as shown in FIG. 13, the rotor 70 has an open construction allowing process fluids and gases to be freely sprayed through the rotor. The rotor 70 is oriented at an inclined angle of about 10 degrees to horizontal.

As shown in FIG. 5, drive pins 80 extend inwardly from the rotor 70, to engage structural features of the carrier 30, such as the ribs 36, 38 and 40. The drive pins 80 allow the rotor to positively engage and spin the carrier 30 with the rotor 70 as the rotor is rotated within the process chamber 110 or 112. The drive pins prevent angular movement between the rotor and the carrier.

Figure 6:
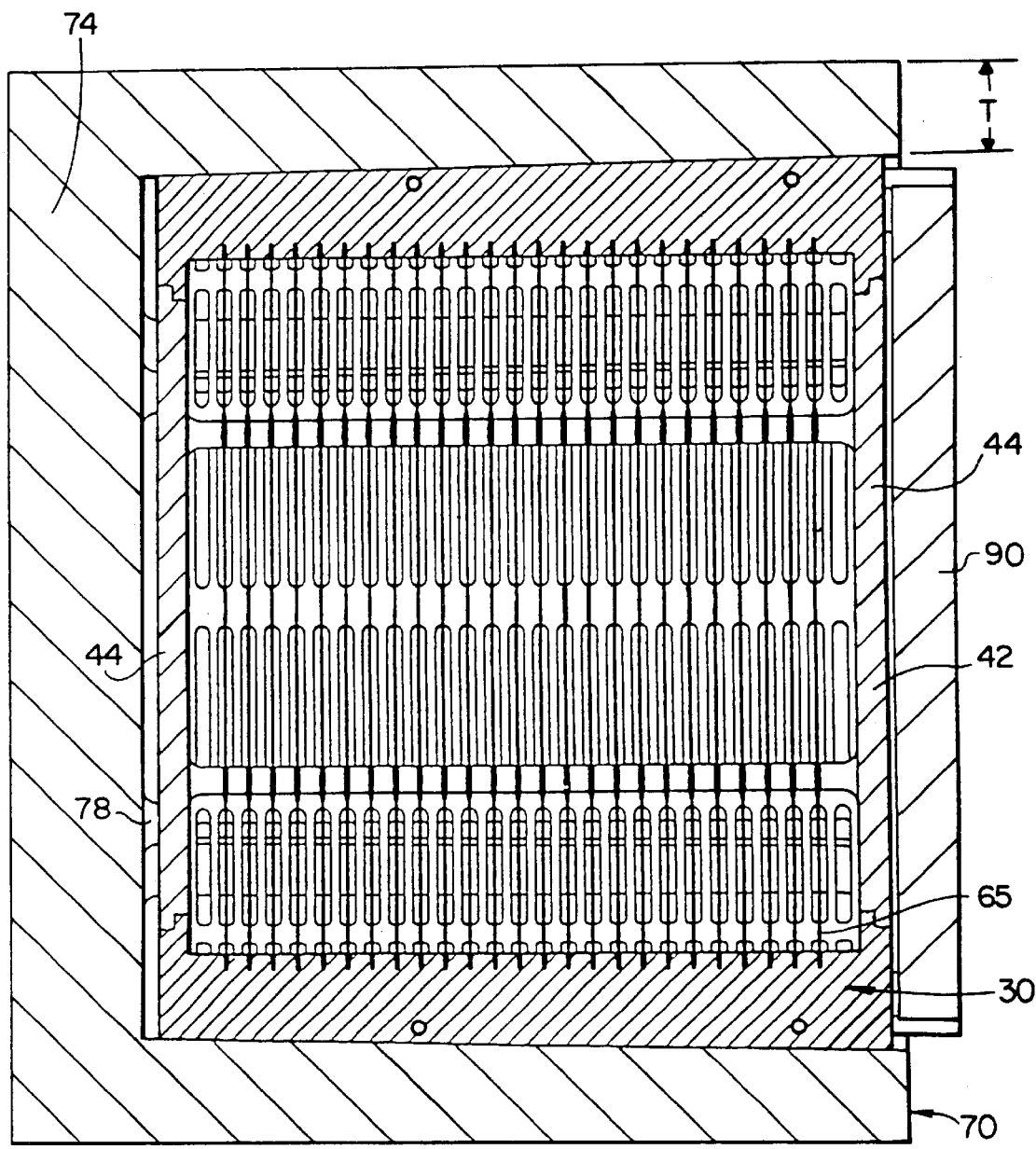
FIG. 6 is a section view taken along line 6—6 of FIG. 5.

As shown in FIGS. 4 and 6, carrier stops 78 extending outwardly from the back ring or plate 74 of the rotor 70 provide a stopping surface for positioning the carrier 30 longitudinally within the rotor 70.

As the rotor 70 and carrier 30 are inclined at an upward angle, as shown in FIG. 4, the carrier 30 is held within the rotor 70, as they both spin during centrifugal processing, via gravity, and also via the taper fit of the carrier 30 into the rotor 70. In some instances, a positive lock may also be desired to prevent the carrier 30 from moving or shifting upwardly and outwardly from the rotor 70 during processing. A carrier key 82 on the rotor 70 may be provided to positively lock the carrier 30 within the rotor 70 during processing. The carrier key is engaged by a key extension 85 on the process robot 108, as the process robot 108 disengages from the carrier 30, after placing the carrier 30 within the rotor 70.

Figure 7:
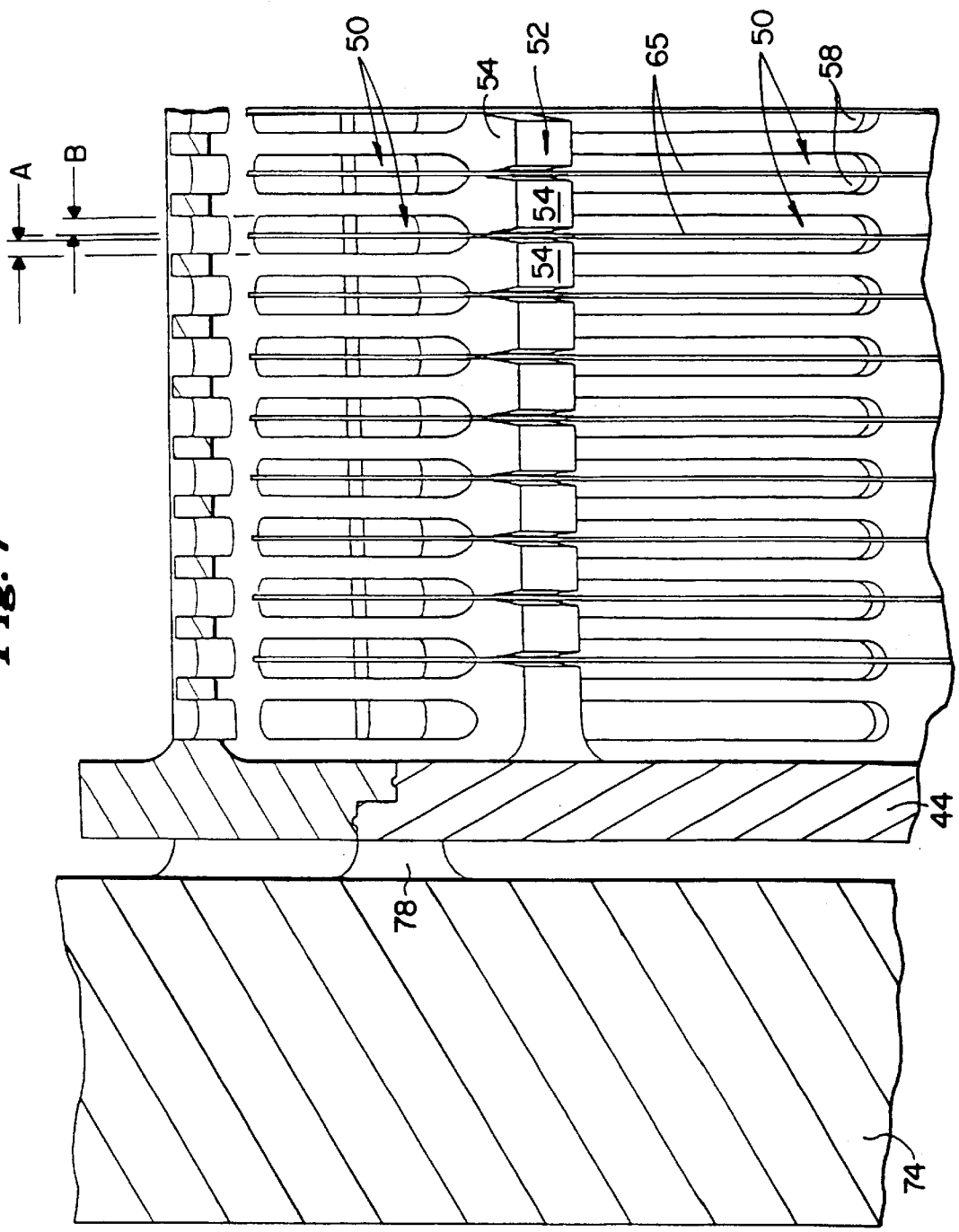
FIG. 7 is an enlarged partial section view taken along line 7—7 of FIG. 5.
Figure 8:
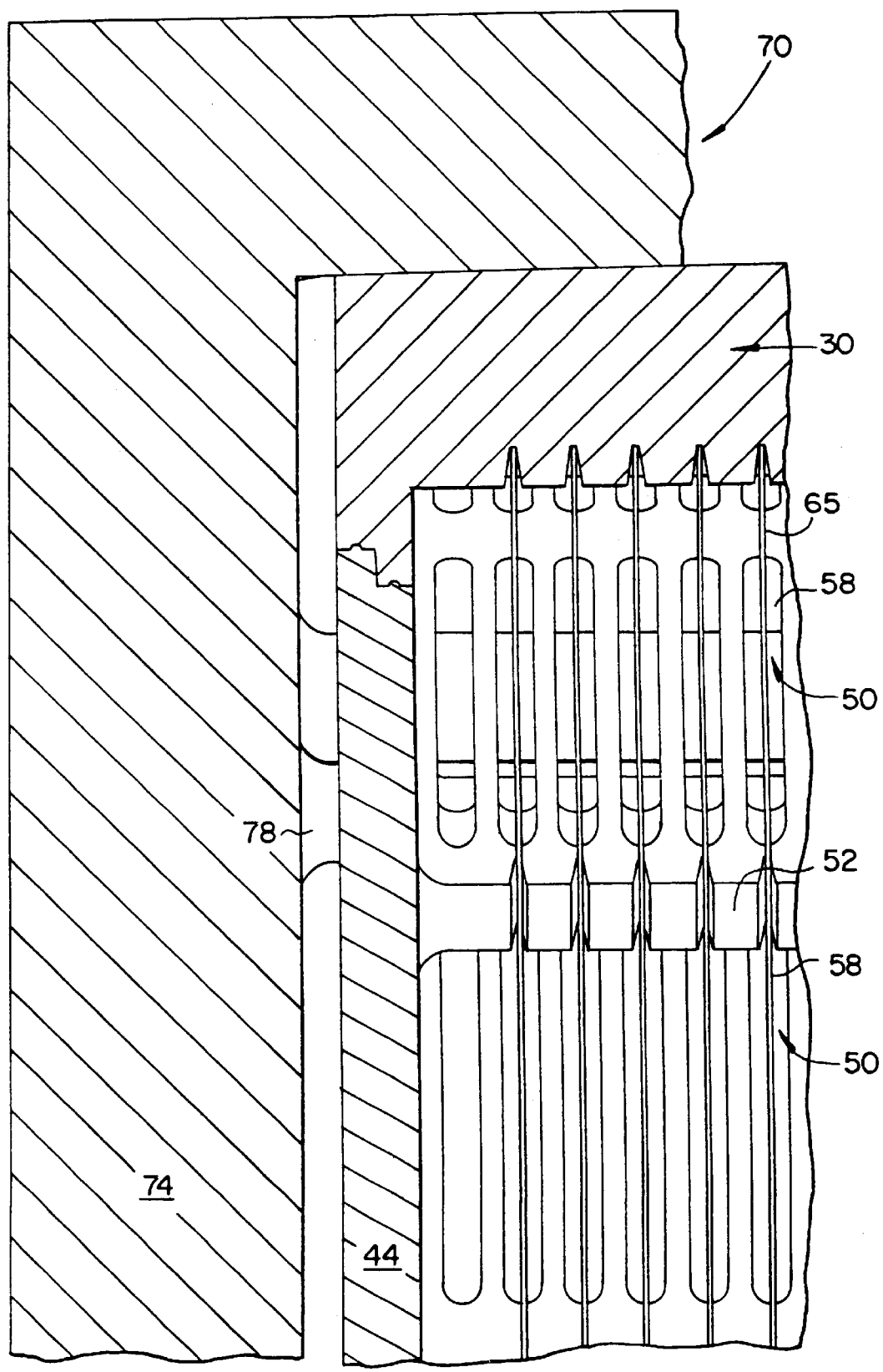
FIG. 8 is an enlarged section of FIG. 6.

Referring to FIGS. 7 and 8, the wafers 65 are centrally located within the comb slots 58. This allows process liquids to be sprayed in a straight line onto the wafers. The wafers 65 are centrally located within the comb slots 58 (as well as the overall wafer slot 50 made up of the individual comb slots 58, at each wafer position) in the sense that, as shown in FIG. 7, the dimension A is no more than 4 times greater than the dimension B (and preferably no more than two times greater than B, and preferably substantially equal to B).

As shown in FIG. 5, an orientation key or pin 88 may optionally be provided on the rotor 70, to prevent the carrier 30 from being placed into the rotor 70, unless the rotor 79 and carrier 30 are properly aligned; i.e., with both at the zero degree or straight up position. The key 88 prevents the carrier 30 from being installed in the rotor 70, unless the carrier 30 is properly oriented and aligned, so that a key slot 89 in the carrier 30 passes over the key 88, as the carrier 30 is moved into the rotor 70. The key 88 may alternatively be placed on the carrier 30 with the key slot 89 located on the rotor 70.

Referring to FIGS. 9–12, in use, the transfer robot 102 transfers wafers 65 from a docked pod 104 into a carrier 30. The transfer robot 102 vertically aligns the horizontally oriented wafer 65 with a wafer slot 50 in the carrier 30. Referring to FIG. 1, although the wafer opening 46 is preferably about 130 degrees, the root diameter of the wafer slots 50 is larger, allowing the wafer 65 to move into the carrier 30. The retainer arms 66 are in the open position O.

When each of the wafer slots 50 within a carrier 30 is filled with a wafer, or if the carrier 30 is otherwise filled with a desired number of wafers 65, the process robot 108 initiates movement of the carrier 30 from the docking station 106 into a process chamber 112.

Figure 11:
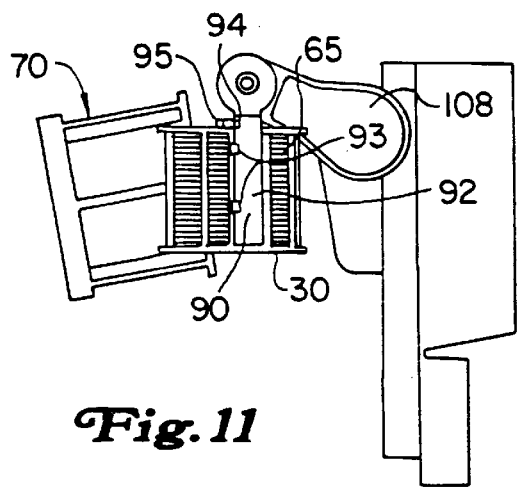
FIG. 11 is a side view of the processing system shown in FIGS. 9 and 10, illustrating the robot engaging a carrier, as shown in FIG. 1.

Referring to FIG. 11, the process robot 108 has an end effector 90 including flat, spaced-apart arms 92. Arm pins 93 protrude upwardly from the arms 92.

FIG. 11 shows the process robot 108 engaging the carrier 30, while the carrier 30 is at the docking station 106 in the position shown in FIG. 9., i.e., the carrier 30 is in a vertical position, and the wafers 65 within the carrier are in a horizontal position. The robot 108 is maneuvered so that the arms 92 of the end effector 90 extend into the arm slots 48 of the carrier 30. The end effector 90 is then moved slightly in or closer to the carrier, so that the arm pins 93 on the arms 92 move into pin holes 95 in the side ribs 38 of the carrier 30. (he pin holes 95 are shown in FIG. 1). Simultaneously, a latch 94 on the end effector 90 engages a latch head 95 on the carrier 30. The end effector 90 is then positively engaged and attached to the carrier 30.

After the carrier 30 is loaded with wafers 65, and is ready for movement by the process robot 108, a retainer actuator 103 below the deck 107 of the docking station 106 extends upwardly to engage the retainer arms 66, and pivot the retainer arms 66 into the closed position C. The retainer arms 66 then remain in the closed position C, preferably via friction in the pivot joints 64.

Figure 14:
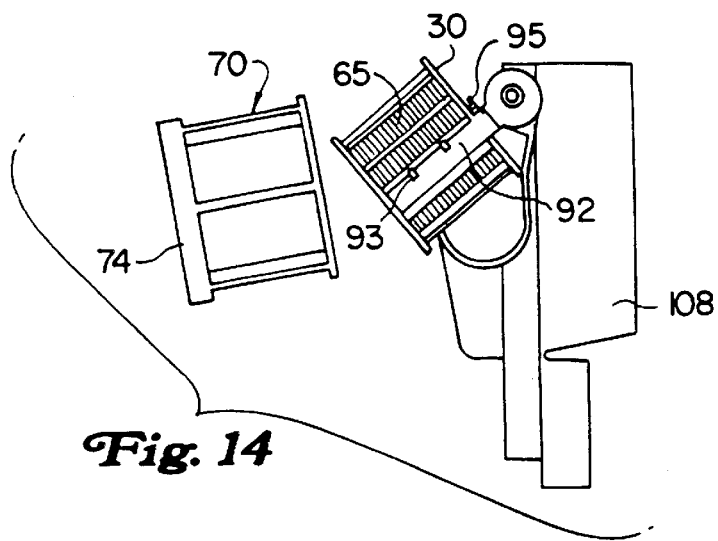
FIG. 14 is a side view of the robot and carrier shown in FIG. 11, with the carrier now moved into an intermediate position.
Figure 15:
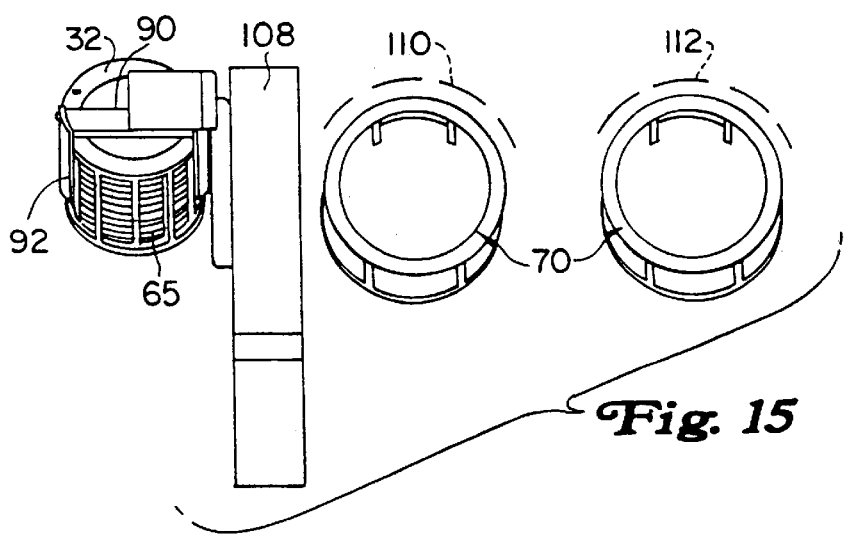
FIG. 15 is a front view thereof.
Figure 16:
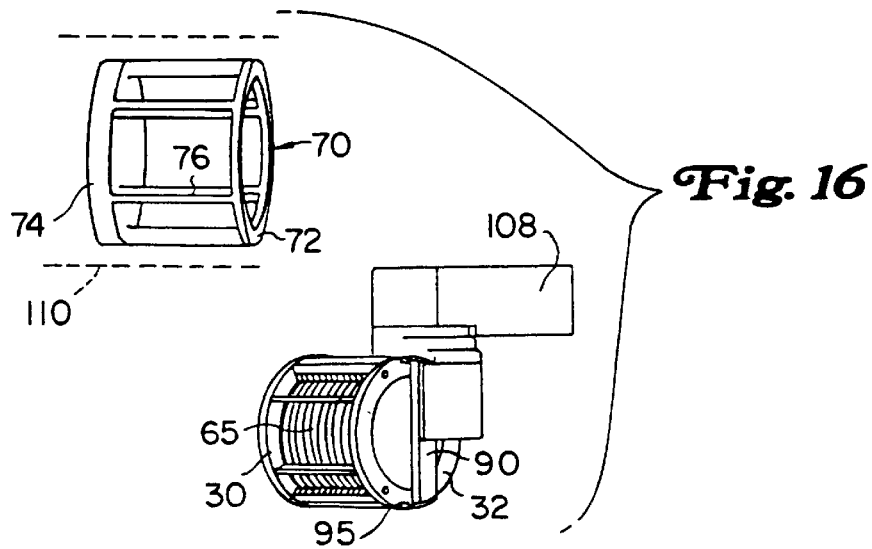
FIG. 16 is a top view thereof.

Referring now to FIGS. 14, 15 and 16, after the end effector 90 is secured to the carrier, the robot 108 lifts the carrier 30 off the deck 107, with the articulated arm segments of the robot 108 pivoting to move the carrier 30 upwardly and clockwise, as shown in comparing the carrier positions in FIGS. 11 and 14.

Figure 12:
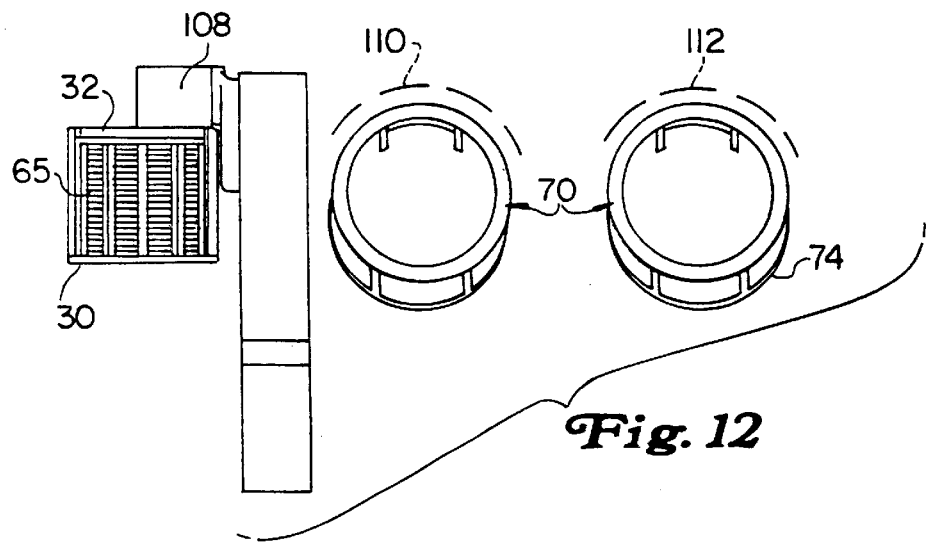
FIG. 12 is a front view thereof.

FIGS. 12 and 13 show the relative positions of the process chamber 110, the process robot 108, and the carrier 30 being moved by the robot 108.

FIGS. 15 and 16 show the relative positions of the robot 108, process chamber 110, and carrier 30, while the carrier 30 is in the position shown in FIG. 14.

Figure 17:
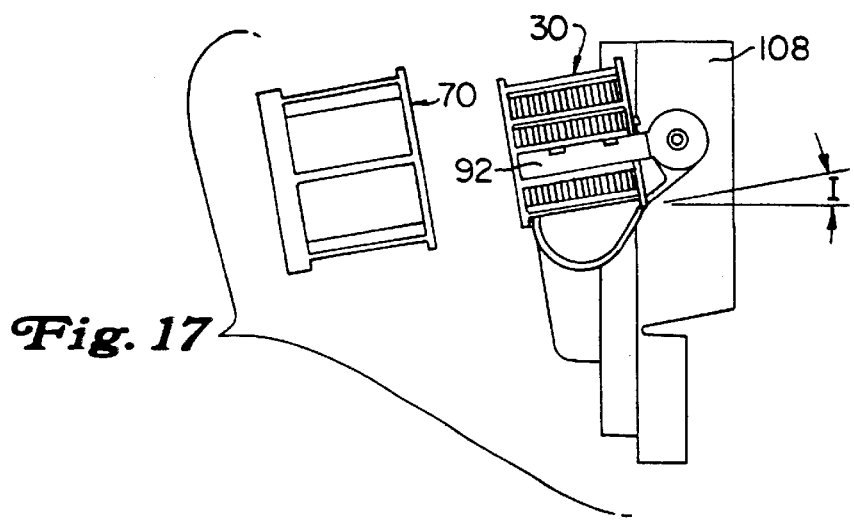
FIG. 17 is a side view of the robot and carrier shown in FIGS. 11 and 14, with the carrier positioned for insertion into a rotor within one of the process chambers shown in FIG. 9.
Figure 18:
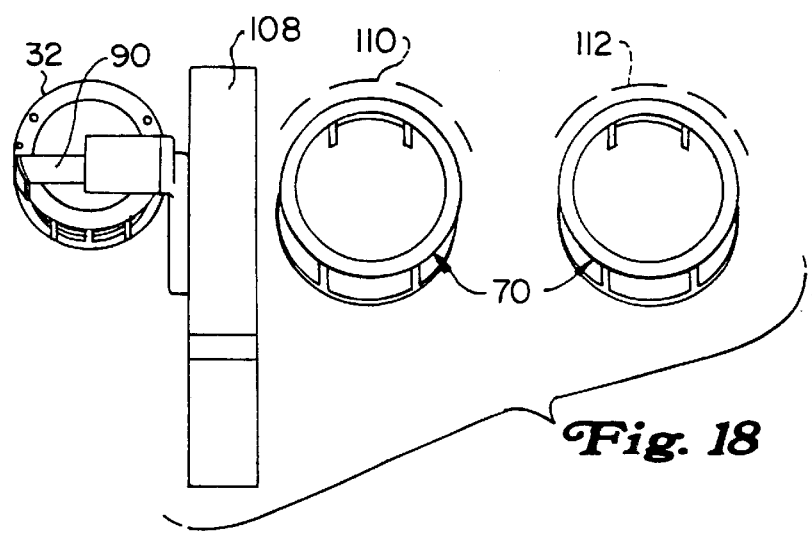
FIG. 18 is a front view thereof.
Figure 19:
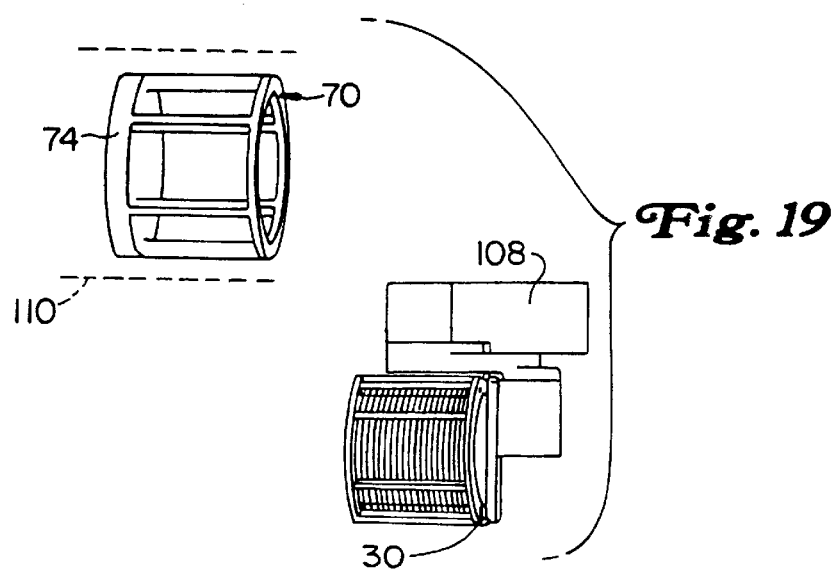
FIG. 19 is a top view thereof.

Referring now to FIGS. 17, 18 and 19, the process robot 108 continues to move a carrier 30 for placement into the rotor 70. As shown in FIG. 17, just prior to placing the carrier 30 into the rotor 70, the robot 108 positions the carrier 30 at an angle I matching the inclination angle of the rotor 70 (preferably about 10 degrees). From the position shown in FIG. 17, the robot 108 can then move the carrier 30 in a straight line into the rotor 70. The movements of the carrier 30 by the process robot 108, as described above, are performed by controlling various motors within the process robot 108, which control the lateral position of the robot 108 along the rail 109; the vertical position of the articulated arm; and the various angular positions of the pivoting segments of the arm.

Figure 20:
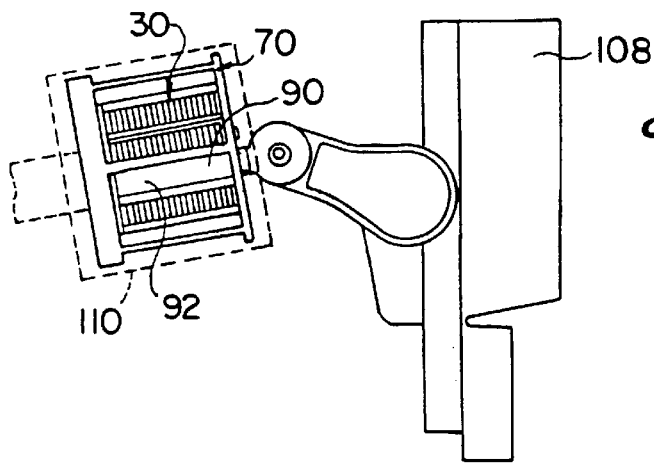
FIG. 20 is a side view of the robot and carrier shown in FIGS. 11, 14 and 17, with the carrier now installed within the rotor shown in FIGS. 11, 14 and 17.
Figure 21:
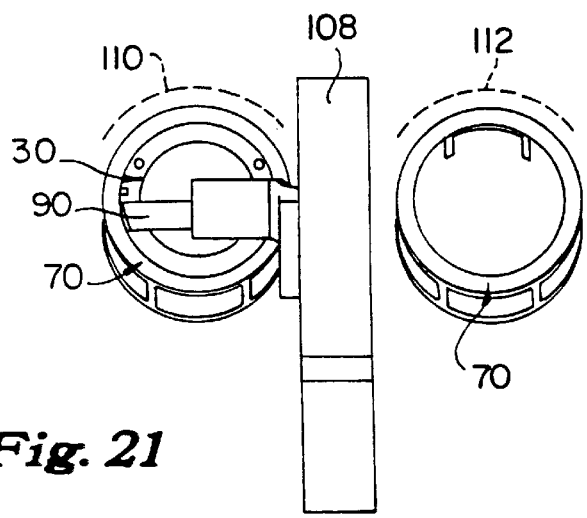
FIG. 21 is a front view thereof.
Figure 22:
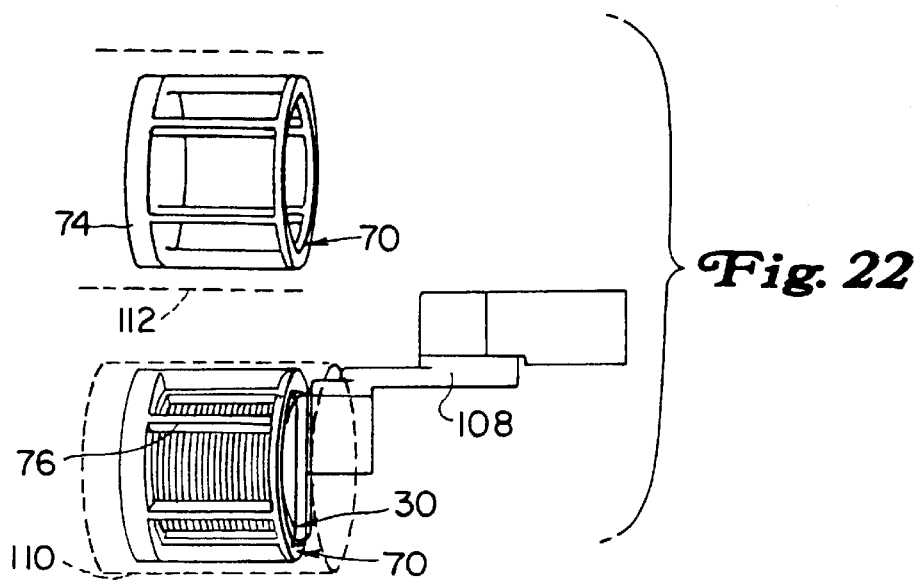
FIG. 22 is a top view thereof.

As shown in FIGS. 20, 21 and 22, the process robot 108 is extended to place the carrier 30 into the rotor 70. The robot 108 moves the end effector 90 down, to withdraw the pins 93 from the pin holes 95, and also to release the latch 94. The end effector 90 is then withdrawn from the carrier 30, and the carrier is supported in the rotor 70.

As the end effector 90 moves down and away from the carrier 30, the carrier locking key 82 (if used) is engaged to mechanically lock the carrier 30 into the rotor 70.

After the end effector 90 is entirely withdrawn, the door to the process chamber 110 is closed, and processing may begin. The carrier 30 spins with the rotor 70 within the chamber 110. The carrier drive pins 80 prevent rotational movement or slippage between the carrier 30 and the rotor 70. The taper of the inside surfaces of the rotor 70, i.e., the inside surfaces of the side bars 76, cause the wafer retainers 62 to compress the wafer edge strip 68 slightly against the edges of the wafers, as the carrier 30 is installed into the rotor 70. The wafers 65 are secured against movement within the carrier 30. Consequently, wafer clocking, or incremental rotation of the wafers within the carrier 30, is prevented, reducing particle generation. The carrier is unloaded following a reverse sequence of steps.

The open designs of the carrier 30 minimize blocking or interference with spraying of process liquids and/or gases onto the wafers 65 within the carrier 30. As shown in FIG. 16, the rotor 70 is largely open, having only the side bars 76 as surfaces for engaging and enclosing the carrier 30.

Referring to FIG. 3, the carrier 30 is also largely open. The wafer opening 46, shown as angle AA in FIG. 3, extends for preferably about 130 degrees, and is entirely open, as shown in FIG. 1. The remaining approximately 230 degrees of the carrier 30 shown in FIG. 3 includes from 25–50%, and preferably about 40%, of structure or side wall surfaces (as measured by the surface area of structure and open spaces) of the carrier 30. Consequently, the carrier 30 has the equivalent of a 270 degree open space with 90 degrees of structure or surfaces.

As shown in FIGS. 4, 6, 7 and 8, the rotor 30 has a front end cap 42 and a back end cap 44, which are pressed into the front ring 32 and back ring 34, respectively, to become permanent parts of the carrier 30. The end caps 42 and 44 provide for more uniform processing of the first and last wafers in the carrier 30, as they simulate an adjacent wafer surface.

The carrier 30 and rotor 70 are preferably made of Teflon (fluorine containing resins), so that they are not affected by reactive or corrosive process fluids or gases. Alternatively, the carrier 30 and rotor 70 may also be made of, e.g., stainless steel.

The wafer slots 50 in the carrier 30, formed by the comb slots 58 at each wafer position, help to reduce damage in the event that a wafer breaks. In many known rotors, if a wafer breaks, wafer pieces will fall partially out of the rotor and catch on other wafers. Consequently a crack or flaw in one wafer can result in the loss of several wafers. Referring to FIG. 1, the configuration of the comb slots 58 helps to contain broken wafer pieces within the rotor. In addition, in the event that a wafer breaks, the forces exerted by the broken wafer pieces tend to be carried more by the tooth slots 56, rather than by the adjacent wafers.

Referring now to FIGS. 23–26, in an alternative design, a carrier 120 has a pair of step ribs 124 connected to and extending between a front ring 32 and a back ring or plate 34. A pair of first lug ribs 126 and second lug ribs 128 similarly connect to and extend between the front ring 32 and back ring or plate 34. The carrier 120 is symmetrical about its vertical center line C—C shown in FIG. 24, with each rib of the pairs of ribs 124, 126 and 128 spaced apart on opposites sides of the center line C—C, as mirror images of each other. In the figures, only one member of each pair of ribs 124, 126 and 128 is shown, while it is apparent that the corresponding member of the pair is at an equivalent position on the opposite side of the centerline C—C.

Figure 23:
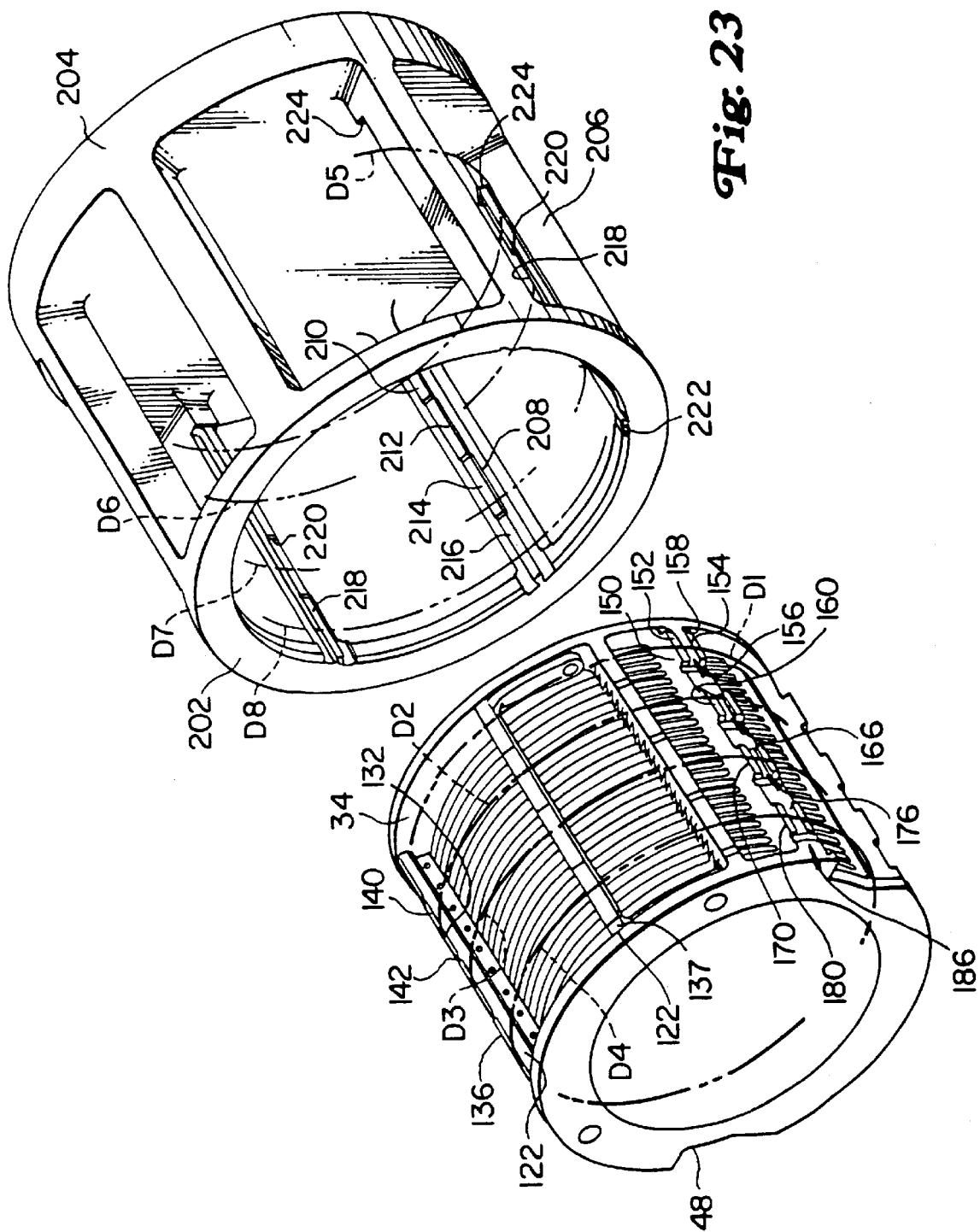
FIG. 23 is a perspective view of an alternative carrier and rotor with the carrier aligned in front of the rotor.
Figure 24:
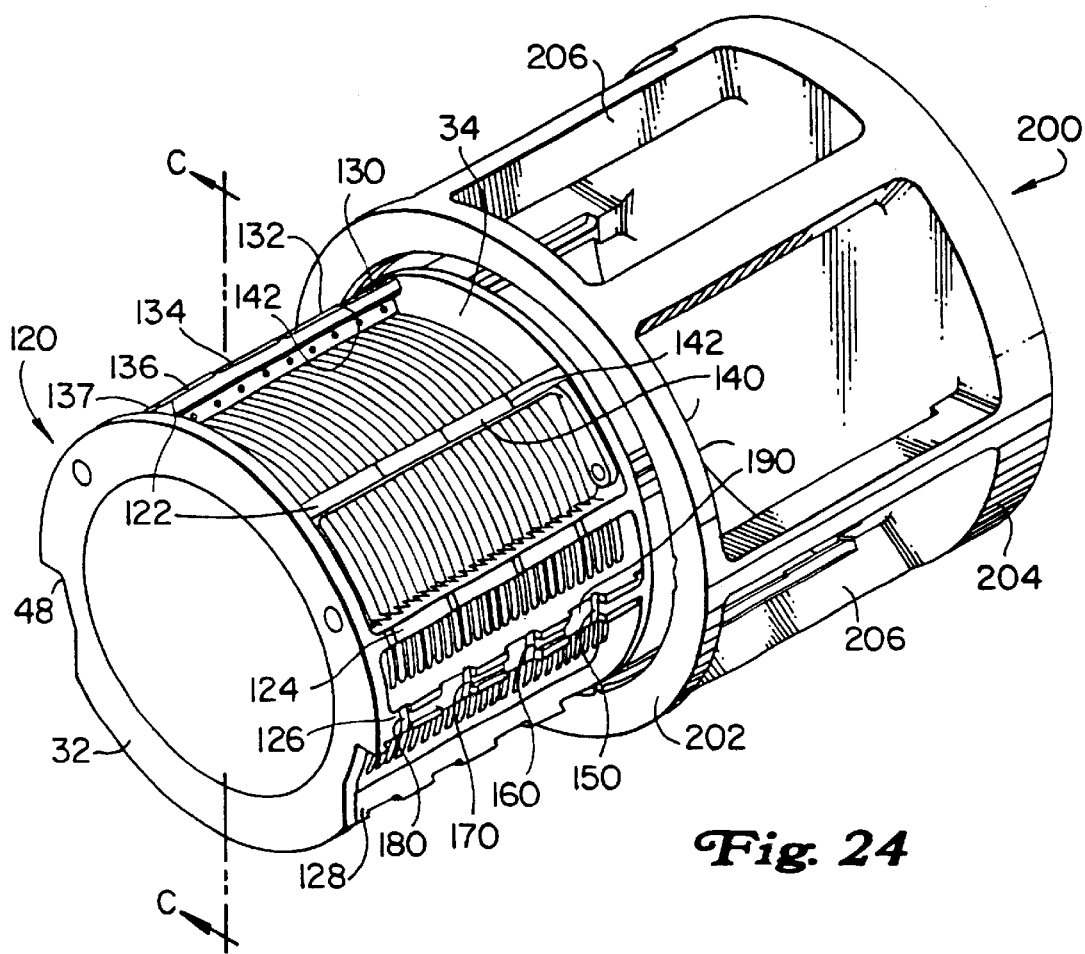
FIG. 24 is a perspective view thereof, with the carrier moving into the rotor, such as via a robot arm.

As shown in FIGS. 23 and 24, each of the ribs 124 has a series of adjoining steps. While varying numbers of steps may be used, in the embodiment shown, there are four steps, a first step 130, a second step 132, a third step 134 and a fourth step 136, and an optional fifth and largest diameter step 137 closest to the front ring 32. Each step has a preferably flat land area 140 oriented parallel to the spin axis S-S of the carrier 120 shown in FIG. 26. Alternatively, the land area 140 may be oriented at an angle to the spin axis, to provide for an angled step, rather than a flat step, as shown.

The land areas 140 of the steps extend into the adjacent step at step face surfaces 142. The step face surfaces 142 are preferably oriented at an angle of from 0–50, preferably 10–40, and more preferably about 25–35 or 30 degrees relative to the land areas 140. Although the steps 130, 132, 134 and 136 are shown having equal lengths and widths, varying step lengths, widths and heights may also be used.

Retainers 122 are pivotably attached to the front and back rings 32 and 34, similar in design and operation to the retainers 66 shown in FIG. 5. However, each retainer 122 has steps 130, 132, 134 and 136 and optionally 137 on its back surface, with the steps on the retainers 122 having the same design and operation as the steps on the ribs 124, 126 and 128.

Referring still to FIGS. 23 and 24, the first and second lug ribs 126 and 128 each have pairs of spaced apart lugs. In the embodiment shown, four pairs of lugs are included, a first lug pair 150, a second lug pair 160, a third lug pair 170, and a fourth lug pair 180. Each of the lug pairs is spaced apart from adjacent lug pairs by gaps 190.

The first lug pair 150 includes an upper or first lug 152 spaced apart from a second or lower lug 154 by a lug slot 156. The second, third and fourth lug pairs preferably have the same lug design, including lug slots 166, 176 and 186 between the lugs 152 and 154. The back ends of each of the lugs 152 and 154 have an angled or chamfered surface 158. The first and second lug ribs 126 and 128 are the same as the first step ribs 124, except that they also include the lug pairs 150, 160, 170 and 180. Consequently, the lug ribs 126 and 128 include the steps 130, 132, 134 and 136, located at the bottom of the slots 156, 166, 176, and 186 formed by the lug pairs 150, 160, 170 and 180.

The first step 130 on each of the ribs 124, 126 and 128, and on the retainers 122 is located on a first diameter D1 shown in dotted line in FIG. 23. Similarly, the second step 132, third step 134, and fourth step 136 on each of the ribs 124, 126 and 128 and the retainers 122 is located on second, third and fourth diameters D2, D3 and D4. The first, second, third and fourth diameters increase incrementally, from the back of the carrier (adjacent to the back ring 34) to the front of the carrier (adjacent to the front ring 32). Preferably, the diameters increase incrementally by from about 0.02–0.10 or 0.04–0.08 inches, and preferably about 0.05–0.07 or 0.06 inches, e.g., D2 is 0.06 inches greater than D1, D3 is 0.06 inches greater than D2, and D4 is 0.06 greater than D3. Correspondingly, each step is e.g., 0.03 inches higher than the previous step.

Referring to FIG. 23, a rotor 200 is adapted to receive and secure the carrier 120. The rotor 200 has side bars attached to and extending between a front ring 202 and a back ring or plate 204. A carrier engaging rail or protrusion 208 is preferably provided on each of the side bars 206, although fewer carrier engaging rails 208 may be used.

Each of the rails 208 includes a series of steps dimensioned to engage the steps on the carrier 120, when the carrier is fully engaged into the rotor. The rails 208 preferably have a rectangular or square stepped cross section. Specifically, in the embodiment shown, the rails 208 on the rotor 200 have a first rotor step 210, a second rotor step 212, a third rotor step 214, a fourth rotor step 216, and optionally a fifth step 217. Each of the rotor steps has a land area 218 and a step face 220, similar to the steps on the carrier 120, as described above. The rotor steps are dimensioned and oriented to engage with the steps on the carrier. Thus the rotor steps are also positioned on diameters D5, D6, D7 and D8 matching or nominally larger than D1, D2, D3 and D4, respectively. Clearance slots 222 are provided at the front ring 202 of the rotor 200, on either side of the rails 208.

The other features of the carrier 120 and rotor 200 are the same as described above with respect to FIGS. 1–22.

In use, the carrier 120 is installed into the rotor 200, as described above, in connection with FIGS. 11–22. However, as shown in FIGS. 23–26, upon initial installation, the first lug pairs 150 on each of the lug ribs 126 and 128 slides over and engages around the fourth rotor step 216 on the side bars 206 of the rotor 200. The chamfered ends 158 center and guide the carrier into the rotor. This initial engagement is shown in FIG. 24. With the carrier 120 in this position, the carrier has significant vertical and horizontal clearance, or clearance in any radial direction, but has very little angular clearance, i.e., the carrier 120 cannot be turned, or can be turned only through a very small angle, (e.g., less than 1 degree) due to the interaction of the lugs 152 and 154 around the rail 208.

As the carrier 120 is moved further into the rotor 200, as shown in FIG. 25, the carrier 120 continues to have a large amount of axial clearance, i.e., the carrier 120 can be freely moved back into the rotor 200. Referring to FIG. 26, as the carrier 120 is moved fully into the rotor 200, the steps 130, 132, 134, and 136 on the ribs 124, 126 and 128, and the retainers 122, of the carrier engage against the steps 210, 212, 214 and 216 on the rails 208 of the rotor 200. However, this engagement between the steps occurs preferably over the last 0.2–0.1 or 0.38–0.87 or 0.75 inches of travel. As a result, the carrier 120 can move axially freely into the rotor 200, until frictional engagement between the steps begins as the carrier 120 moves into its near fully installed position. The installation movement of the carrier 120 stops when the first lug pairs 150 come to rest against mechanical stops 224 at the back of the rails 208. If the land areas 140 and 218 are inclined at an angle, rather than flat, engagement between the steps may begin earlier as the carrier 120 is installed into the rotor 200.

The diameters preferably increase in equal increments from the smallest diameter circumscribing the first steps 130 on the carrier 120, to the largest diameter circumscribing the fourth (or higher) step 136 on the carrier 120. When the carrier is fully engaged in the rotor, there is a close tolerance fit between them. Until the carrier is fully almost engaged in the rotor, there is a clearance between them. As the carrier 120 is inserted into the rotor 200, the lugs 152 and 154 guide the carrier so that the diameters circumscribing the steps 130, 132, 134 and 136 are centered and coaxial with the diameters circumscribing the rotor steps 210, 212, 214 and 216 on the rotor 200.

During processing, as the rotor rotates, the lug pairs 150, 160, 170 and 180, engaged around the rails 208 lock the carrier and rotor together, so that the carrier does not shift angularly within the rotor. The carrier may be moved quickly and easily into the rotor, until the last final installation movement, when the steps engage each other, and secure the carrier within the holder. The use of the incremental steps reduces the need for precise dimensional tolerances on the carrier and/or the rotor. This allows the carrier and rotor to be more easily manufactured, especially when made of Teflon polyflouroresins.

Thus, novel wafer handling systems, carriers, rotors and methods have been shown and described. Various modifications may, of course, be made, within departing from the spirit and scope of the invention. The invention, therefore, should not be limited, except by the following claims and their equivalents.

What is claimed is:

1. A processing system comprising:
    a carrier having a tapered outer surface and a plurality of wafer slots;
    a centrifugal processor including a rotor having an inner surface with a taper substantially matching the taper of the carrier; and
    a robot for installing and removing the carrier into and out of the rotor.

2. The processing system of claim 1 with the carrier having a wafer opening of from about 110 to 150 degrees.

3. The processing system of claim 1 further comprising a pair of wafer retainers pivotably attached to the carrier.

4. The processing system of claim 1 further comprising means for securing the carrier onto the robot.

5. The processing system of claim 4 where the means for securing comprises at least one pin on the robot engageable into the carrier.

6. The processing system of claim 4 wherein the means for securing includes a latch on the robot engageable onto the carrier.

7. The processing system of claim 1 with the robot including an end effector having a pair of spaced apart arms, and the carrier has arm slots engageable by the arms.

8. The processing system of claim 1 with the carrier having a wafer opening of about 110 to 115 degrees, and having a cylindrical sidewall having openings extending through it, with the openings forming from about 50 to 70% of the surface area of the cylindrical sidewall.

9. The processing system of claim 1 further comprising end caps on ends of the carrier.

10. The processing system of claim 1 wherein the carrier includes wafer combs for holding wafers in a spaced array, with the carrier further including a cylindrical sidewall having through slots positioned so that a wafer in the combs is centered in the through slots.

11. A processing system comprising:
    a carrier having a plurality of stepped outer surfaces and a plurality of wafer slots for holding wafers;
    a centrifugal processor including a rotor having a plurality of stepped inner surfaces;
    a robot for installing and removing the carrier into and out of the rotor;
    with the stepped inner surfaces of the rotor engaging the stepped outer surfaces of the carrier, when the carrier is installed in the rotor.

12. The processing system of claim 11 with the carrier having a wafer opening of from about 110 to 150 degrees.

13. The processing system of claim 11 further comprising a pair of wafer retainers pivotably attached to the carrier and movable from an open position for loading and unloading wafers into the carrier, to a closed position, where the wafer retainers contact the wafers at circumferential edges of the wafers, to secure the wafers into the carrier.

14. The processing system of claim 11 further comprising means for securing the carrier onto the robot.

15. The processing system of claim 14 where the means for securing comprises a plurality of lug pairs extending outwardly on the carrier, with each lug pair forming a lug slot engageable by a protrusion on the robot.

16. The processing system of claim 11 with the robot including an end effector having a pair of spaced apart arms, and the carrier has arm slots engageable by the arms.

17. The processing system of claim 11 with the carrier having a wafer opening of about 110 to 115 degrees, and having a cylindrical sidewall having openings extending through it, with the openings forming from about 50 to 70% of the surface area of the cylindrical sidewall.

18. The processing system of claim 11 wherein the carrier includes wafer combs for holding wafers in a spaced array, with the carrier further including a cylindrical sidewall having through slots positioned so that a wafer in the combs is centered in the through slots.

19. The processing system of claim 11 further comprising a plurality of lug pairs on the carrier engageable around at least one of the stepped inner surfaces on the rotor.

20. The processing system of claim 11 where the stepped inner surfaces of the rotor are flat and extend parallel to an axis of rotation of the rotor.

21. A processing system comprising:
    a carrier having a plurality of wafer slots for holding wafers, and a plurality of outer steps of incrementally increasing height disposed along an outer surface of the carrier;
    a centrifugal processor including a rotor having a plurality of inner steps dimensioned to engage the outer steps of the carrier; and
    a robot for installing and removing the carrier into and out of the rotor, wherein the inner steps of the rotor engage the outer steps of the carrier when the carrier is installed in the rotor.

22. The processing system of claim 21 wherein successive outer steps disposed in a longitudinal direction along the outer surface of the carrier increase in height in equal increments.

23. The processing system of claim 21 further comprising a plurality of drive pins on the rotor for engaging the carrier so that the rotor can spin the carrier.

24. A processing system comprising:
- a carrier having a plurality of wafer slots for holding wafers, and a first engagement means disposed on an outer surface of the carrier;
- a centrifugal processor including a rotor having a second engagement means disposed on an inner surface of the rotor, the second engagement means dimensioned to engage the first engagement means, and
- transport means for installing and removing the carrier into and out of the rotor, wherein the second engagement means engages the first engagement means when the carrier is installed in the rotor.

25. The processing system of claim 24 wherein the first engagement means comprises a plurality of steps that incrementally increase in height along a longitudinal direction of the outer surface of the carrier.

* * * * *